United States Patent
Joo et al.

(10) Patent No.: US 9,593,241 B2
(45) Date of Patent: Mar. 14, 2017

(54) RESIN COMPOSITION FOR ENCAPSULATING OPTICAL ELEMENT

(71) Applicant: DONGJIN SEMICHEM Co., Ltd., Incheon (KR)

(72) Inventors: Han Bok Joo, Hwaseong (KR); Sun Sik Song, Hwaseong (KR); Hyeok Yong Kwon, Hwaseong (KR); Eun Ju Park, Hwaseong (KR); Jae Hyun Kim, Hwaseong (KR); Young Je Kwark, Seoul (KR); Hee Chun Eun, Seoul (KR); Hee Eun Im, Seoul (KR)

(73) Assignee: DONGJIN SEMICHEM CO., LTD., Incheon (KR)

( * ) Notice: Subject to any disclaimer, the term of this patent is extended or adjusted under 35 U.S.C. 154(b) by 0 days.

(21) Appl. No.: 14/769,155

(22) PCT Filed: Feb. 24, 2014

(86) PCT No.: PCT/KR2014/001458
§ 371 (c)(1),
(2) Date: Aug. 20, 2015

(87) PCT Pub. No.: WO2014/133287
PCT Pub. Date: Sep. 4, 2014

(65) Prior Publication Data
US 2015/0376407 A1 Dec. 31, 2015

(30) Foreign Application Priority Data
Feb. 28, 2013 (KR) .................. 10-2013-0021845

(51) Int. Cl.
| | | |
|---|---|---|
| *C08L 83/04* | (2006.01) | |
| *H01L 23/29* | (2006.01) | |
| *C08L 83/06* | (2006.01) | |
| *C08G 77/00* | (2006.01) | |
| *C08G 77/62* | (2006.01) | |
| *C08G 77/04* | (2006.01) | |
| *C08G 77/20* | (2006.01) | |
| *H01L 33/56* | (2010.01) | |

(52) U.S. Cl.
CPC .............. *C08L 83/06* (2013.01); *C08L 83/04* (2013.01); *H01L 23/296* (2013.01); *C08G 77/045* (2013.01); *C08G 77/20* (2013.01); *C08G 77/62* (2013.01); *C08G 77/80* (2013.01); *H01L 33/56* (2013.01)

(58) Field of Classification Search
None
See application file for complete search history.

(56) References Cited

U.S. PATENT DOCUMENTS

| | | | | |
|---|---|---|---|---|
| 7,375,170 B2* | 5/2008 | Oikawa | ..................... | C07F 7/21 525/100 |
| 2010/0280190 A1* | 11/2010 | Saito | ........................ | C07F 7/21 525/477 |
| 2013/0096249 A1* | 4/2013 | Kawabata | ............ | C08G 77/045 524/547 |

FOREIGN PATENT DOCUMENTS

| | | |
|---|---|---|
| KR | 10-2007-0093089 | 9/2007 |
| KR | 10-2009-0107882 | 10/2009 |
| KR | 10-2011-0012581 | 2/2011 |
| KR | 10-2012-0017397 | 2/2012 |
| WO | 2011-034322 | 3/2011 |

* cited by examiner

*Primary Examiner* — Marc Zimmer
(74) *Attorney, Agent, or Firm* — Lex IP Meister, PLLC

(57) ABSTRACT

The present invention relates to a resin composition for encapsulating an optical device and more particularly, the resin composition for encapsulating optical device of the invention comprising a polyhedral oligomeric silsesquioxane (POSS) of which the compatibility with resins is enhanced by its cross-linking ability and an organic polysilazane compound has excellent mechanical properties, and enhanced adhesive strengths to a base material and barrier properties against moisture or oxygen by having excellent solubility with siloxane resins and significantly improved outgassing phenomenon, thus being able to be applied to encapsulation process for various optical devices, especially the encapsulation process of thick films.

11 Claims, No Drawings

RESIN COMPOSITION FOR ENCAPSULATING OPTICAL ELEMENT

FIELD OF THE INVENTION

The present invention relates to a thermosetting resin composition for encapsulating an optical device and more particularly, to a resin composition for encapsulating an optical device comprising a polyhedral oligomeric silsesquioxane (POSS) of which the compatibility with resins is enhanced by its cross-linking ability and an organic polysilazane compound, which has excellent mechanical properties, and enhanced adhesive strengths to a base material and barrier properties against moisture or oxygen.

BACKGROUND OF THE INVENTION

As organic materials which are included in optical devices such as OLED, LCD, etc. are very vulnerable to oxygen in the air or water vapors, their power reduction or early performances degradation may occur when exposed to oxygen or water vapors. Therefore, methods for extending the lifespan of the devices have been developed by protecting them using a metal or glass, but the metal is generally lack of transparency and the glass is short of flexibility.

Therefore, clear barrier films or encapsulating compositions having flexibility to be used for encapsulating optical devices including a light, bendable, and flexible OLED have been developed and in particular, silicon-based polymeric compounds having excellent light resistance and light transparency have been continuously preferred and developed as an encapsulating material for optical devices.

As a result of this, a composition of which the physical properties are improved by using silsesquioxane has been disclosed, but since the silsesquioxane used in there is a powder-type having a mixed structure of a ladder and cage, it is inappropriate as an encapsulating material for most optical devices, especially, LED which require a solvent-free process.

Further, a composition of which the adhesive strengths and barrier properties are enhanced by using silazane has been disclosed, but when applied to a thick film (1 mm or over) instead of a thin film, it caused a severe outgassing problem, making it difficult to achieve even film properties and its barrier properties were thus degraded.

SUMMARY OF THE INVENTION

In order to solve the above problems, it is an object of the present invention to provide a resin composition for encapsulating an optical device using a modified silsesquioxane and an organic polysilazane which enhances its compatibility with a resin, enables a solvent-free process, and can reduce outgassing problems, and an optical device encapsulating method using the same.

To achieve the above objects, the present invention provides a resin composition for encapsulating an optical device, comprising 1) a polyhedral oligomeric silsesquioxane (POSS) of the following chemical formula 1-1 or 1-2; and 2) an organic polysilazane comprising repeating units as represented by the following chemical formula 2:

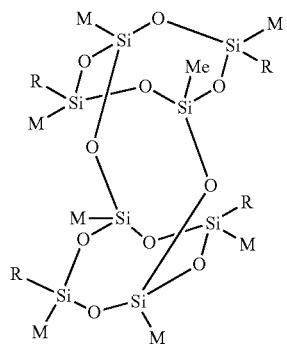

[Chemical formula 1-1]

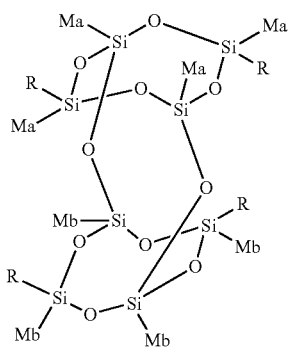

[Chemical formula 1-2]

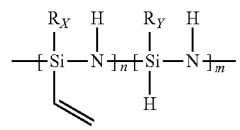

[Chemical formula 2]

wherein,
R is each independently a substituent of the following chemical formula 3-1 or 3-2;

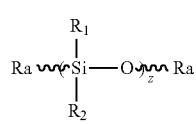

[Chemical formula 3-1]

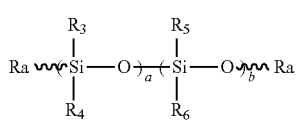

[Chemical formula 3-2]

wherein,
$R_1$ to $R_6$ are each independently a hydrogen, an alkyl or alkenyl having 1 to 20 carbon atoms, or an aryl having 6 to 50 carbon atoms;
one Ra is a hydrogen atom or a chlorine atom and the other is a single bond which links to Si of chemical formula 1-1;
z is an integer of 3 to 20, preferably an integer of 5 to 20;
a and b are each independently an integer of 0 to 20, with the proviso that a+b is an integer of 3 to 20;

M, Ma and Mb are each independently a methyl or phenyl,

Rx and Ry are each independently an alkyl or alkenyl having 1 to 20 carbon atoms, or an aryl having 6 to 50 carbon atoms, preferably, methyl, ethyl, vinyl, or phenyl, and more preferably, Rx is methyl, ethyl or phenyl and Ry is methyl, ethyl or vinyl; and m and n are each independently an integer of 1 to 20, with the proviso that m+n is 2 to 21.

Further, the present invention provides a method of encapsulating an optical device using an encapsulating composition, characterized by using the above optical device encapsulating composition.

Further, the present invention provides an optical device encapsulating film prepared with the above optical device encapsulating composition.

As the resin composition for encapsulating optical device of the present invention has an improved solubility with siloxane resin by including polyhedral oligomeric silsesquioxane (POSS) of which the compatibility with a resin is enhanced by its cross-linking ability, thus enabling a solvent-free process, it has excellent encapsulating process properties, enhanced cross-linking density and superior mechanical properties. Further, the resin composition of the invention enables thermosetting process by including an organic polysilazane compound and a modified polysilazane compound, through which outgassing phenomenon can be significantly improved by eliminating unreacted monomers that cause outgassing and thus, it can remarkably improve barrier properties.

Accordingly, since the resin composition for encapsulating optical device of the invention enables a solvent-free process, it can be usefully used as a composition for encapsulating optical devices, especially LED, and since it improves outgassing phenomenon so that even film formation is possible, it can be applied to the encapsulation process of thick films of several μm to several mm.

DETAILED DESCRIPTION OF THE INVENTION

The resin composition for encapsulating optical device of the invention is characterized by comprising polyhedral oligomeric silsesquioxane (POSS) of which the compatibility with a resin is enhanced by its cross-linking ability and an organic polysilazane compound.

Hereinafter, the invention will be described in detail.

Polyhedral oligomeric silsesquioxane (POSS) in a cage type that is commonly used in the field to which the invention pertains is synthesized as a powder form. Thus, when used in a resin composition for encapsulation, it has poor compatibility with a siloxane resin which is used as a main resin and thus it is not suitable for resin compositions for encapsulation. Since it needs to be dissolved in an organic solvent in order to increase compatibility with siloxane resin, it is not suitable for the preparation of resin compositions for solvent-free encapsulation.

Hence, the composition of the invention includes polyhedral oligomeric silsesquioxane of the following chemical formula 1-1 or 1-2 in order to enhance compatibility with the siloxane resin.

[Chemical formula 1-1]

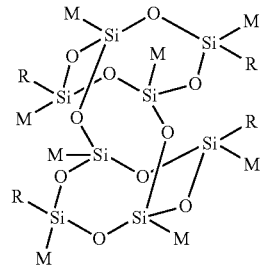

[Chemical formula 1-2]

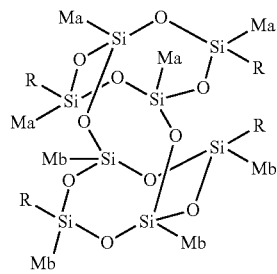

In the above formulae,

R is each independently a substituent of the following chemical formula 3-1 or 3-2;

[Chemical formula 3-1]

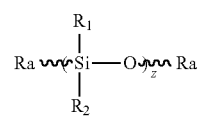

[Chemical formula 3-2]

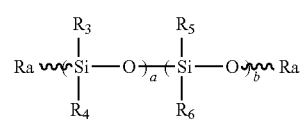

wherein, $R_1$ to $R_6$ are each independently a hydrogen, an alkyl or alkenyl having 1 to 20 carbon atoms, or an aryl having 6 to 50 carbon atoms, preferably a hydrogen, methyl, ethyl, vinyl or phenyl, and more preferably $R_1$ is a hydrogen or methyl, $R_2$ is a methyl or phenyl, $R_3$ is a hydrogen, methyl or phenyl, $R_4$ is a hydrogen, methyl or vinyl, $R_5$ is a methyl, vinyl or phenyl, and $R_6$ is a methyl or ethyl;

one Ra is a hydrogen atom or a chlorine atom and the other is a single bond which links to Si of chemical formula 1-1;

z is an integer of 3 to 20, preferably an integer of 5 to 20;

a and b are each independently an integer of 0 to 20, with the proviso that a+b is an integer of 3 to 20; and M, Ma and Mb are each independently a methyl or phenyl.

The compounds of the above chemical formula 1-1 or 1-2 may be synthesized via a condensation reaction in distilled water from the compound of the following chemical formula 3-2, the compound of the following chemical formula 3-3, or the compounds of the following chemical formulae 3-4 and 3-5 as a reactant, in the center of the compound of the following chemical formula 3-1:

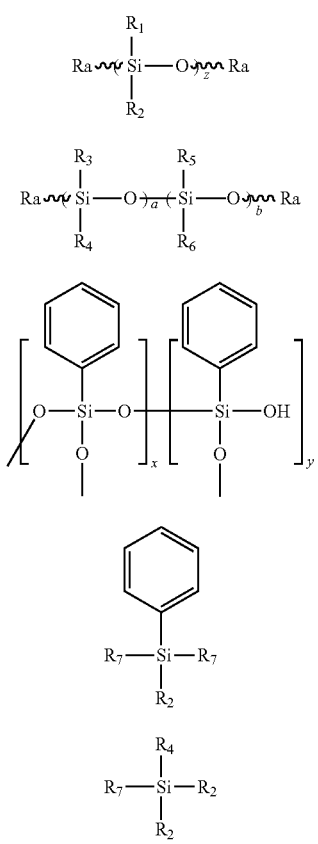

[Chemical formula 3-1]

[Chemical formula 3-2]

[Chemical formula 3-3]

[Chemical formula 3-4]

[Chemical formula 3-5]

In the above formulae, $R_1$ to $R_6$, z, a, and b are the same as defined above;

Ra and $R_7$ are each independently a hydrogen or chlorine; and x and y are each independently an integer of 1 to 100.

The above polyhedral oligomeric silsesquioxane to be used in the invention not only has sufficient compatibility with the siloxane resin without the need of a dissolving process in organic solvents but also can enhance the cross-linking density and mechanical properties of the resin composition by containing cross-linkable regions and it can also contribute to the improvement of gas barrier properties.

The above polyhedral oligomeric silsesquioxane in the invention may be used in an amount of 1 to 20 wt. % of the total composition, and when it exceeds the above amount, its compatibility with the siloxane resin may be decreased.

The composition of the invention comprises an organic polysilazane comprising repeating units as represented by the following chemical formula 2, in order to eliminate outgassing phenomenon which decreases barrier properties.

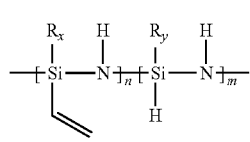

[Chemical formula 2]

In the above formula,

Rx and Ry are each independently an alkyl or alkenyl having 1 to 20 carbon atoms, or an aryl having 6 to 50 carbon atoms, preferably, methyl, ethyl, vinyl, or phenyl, and more preferably, Rx is methyl, ethyl or phenyl and Ry is methyl, ethyl or vinyl; and m and n are each independently an integer of 1 to 20, with the proviso that m+n is 2 to 21.

The above organic polysilazane compound to be used in the invention is a compound capable of thermosetting, and when vacuum/heat combination process is applied to the resin composition for encapsulation comprising the organic polysilazane compound, it can improve the outgassing phenomenon by eliminating unreacted monomers which are outgassing factors. Accordingly, as the use of the composition of the invention comprising the above organic polysilazane can produce an encapsulating film with excellent surface properties, it can be applied to the encapsulation process of thick films of several μm to several mm.

The above organic polysilazane compound in the invention may be used in an amount of 0.1 to 10 wt. % of the total composition, and when it exceeds the above amount, it may aggravate the outgassing phenomenon, decreasing the barrier properties.

The composition of the invention may further comprise a compound comprising repeating units as represented by the following chemical formula 4, in order to enhance the barrier properties by improving the outgassing phenomenon.

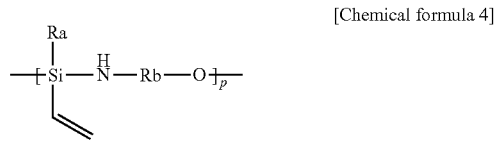

[Chemical formula 4]

In the above formula,

Ra is an alkyl having 1 to 20 carbon atoms, or an aryl having 6 to 50 carbon atoms;

Rb is a hydrocarbon having 1 to 20 carbon atoms, preferably a hydrocarbon having 1 to 5 carbon atoms; and p is an integer of 1 to 15.

The compound of chemical formula 4 may be synthesized via a solution polymerization in the center of the compound of the following chemical formula 4-1 and the compound of the following chemical formula 4-3, or the compound of the following chemical formula 4-2 and the compound of the following chemical formula 4-3:

[Chemical formula 4-1]

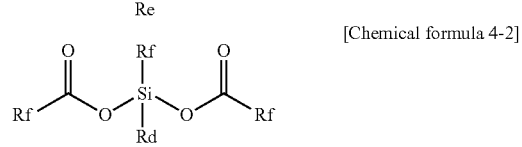

[Chemical formula 4-2]

[Chemical formula 4-3]

In the above formulae, $R_c$ is a hydrogen or chlorine; and $R_d$, $R_e$ and $R_f$ are each independently a hydrogen, an alkyl or alkenyl having 1 to 20 carbon atoms, or an aryl having 6 to 50 carbon atoms.

The above modified polysilazane compound in the invention may be used in an amount of 0.1 to 15 wt. % of the total composition, and when it exceeds the above amount, it may aggravate the outgassing phenomenon, decreasing the barrier properties.

The resin composition for encapsulating optical device of the invention may comprise, in addition to the above polyhedral oligomeric silsesquioxane and organic polysilazane, a commonly-used siloxane resin, cross-linking resin, silane coupling agent and so on in an ordinary amount. Preferably, the composition of the invention may further comprise the above modified polysilazane. Furthermore, the composition may further comprise a catalyst or a reaction retardant.

In one embodiment of the invention, the composition of the invention may comprise 1 to 20 wt. % of the polyhedral oligomeric silsesquioxane, 0.1 to 10 wt. % of the organic polysilazane, 30 to 85 wt. % of the siloxane resin, 5 to 40 wt. % of the cross-linking resin, and 0.05 to 10 wt. % of the silane coupling agent, based on the total composition. Further, the composition may preferably comprise 0.1 to 15 wt. % of the modified polysilazane compound. More preferably, the compound may further comprise 1 to 3000 ppm of the catalyst or 1 to 1000 ppm of the reaction retardant.

The siloxane resin to be used in the invention may include polymethylvinyl siloxane, poly(methyl phenyl)hydrosiloxane, poly(methylphenyl)siloxane, poly(phenylvinyl)-co-(methylvinyl)silsesquioxane, PDV-1635, PMV-9925 and PVV-3522 of Gelest Inc., etc., the cross-linking resin may include silsesquioxane copolymer, phenylhydrosilsesquioxane or dimethylsilylphenylether, the silane coupling agent may include methacrylate cyclosiloxane, the catalyst may include a platinum catalyst, and the reaction retardant may include ethynyltrimethylsilane or ethynyltriethylsilane but not be limited thereto, and may include one or more of these, respectively.

Further, the present invention provides an optical device encapsulating method using the above optical device encapsulating composition and an optical device encapsulating film prepared with the above optical device encapsulating composition.

The optical device encapsulating method of the invention is characterized in that the optical device encapsulating composition according to the invention is used in a method of encapsulating an optical device using an optical device encapsulating composition. With the exception that the above optical device encapsulating composition is used, any known processes can be certainly applied to other processes applied to the encapsulation method.

Also, the invention provides the optical device encapsulating film prepared from the above optical device encapsulating composition, and as the optical device encapsulating film of the invention has not only excellent light transmittance and refractive index but also remarkably improved hardness, adhesive strength, and water vapor permeability, it is effective in extending the lifespan of the optical devices when used as an encapsulating thin film of various optical devices and especially, it can be used as an encapsulating film of LED which needs to be manufactured by a solvent-free process and requires a thick film of several μm to several mm.

For better understanding of the present invention, preferred examples follow. The following examples are intended to merely illustrate the invention without limiting the scope of the invention.

EXAMPLES

Synthesis Example 1

Synthesis of Polyhedral Oligomeric Silsesquioxane

Polyhedral oligomeric silsesquioxane was synthesized by stirring the mixture of tetrasilanolphenyl POSS, dichloromethylphenylsilane, and chlorodimethylvinylsilane as reactants while slowly dropwise adding at a room pressure distilled water to the mixture at about 30° C., then further stirring them at 50° C. for about 3 hours or so, and then eliminating solvents therefrom.

Synthesis Example 2

Synthesis of Modified Polysilazane

Modified polysilazane was synthesized by adding pyridine as reaction media to dichloromethylvinylsilane, then stirring them while slowly dropwise adding 2-amonoethanol thereto, and then purifying a thus produced salt using dichloromethane and heptane, and eliminating solvents.

Comparative Synthesis Example 1

Synthesis of Cage Type Oligo-POSS

It was synthesized via hydrosilylation reaction of octa vinyl ROSS and hydrogenated poly(methylphenyl)siloxane resin under a platinum catalyst.

Comparative Synthesis Example 2

Synthesis of Cage Type Oligo-POSS

It was synthesized via hydrosilylation reaction of octa vinyl ROSS and vinyl terminated poly(methylphenyl)siloxane resin under a platinum catalyst.

Examples 1-3 and Comparative Examples 1-4

실시예 1-3 및 비교예 1-4

The resin compositions for encapsulating optical devices were prepared in accordance with the compositions set forth in the following Table 1. A revolution/rotation vacuum deaerator was used to mix the ingredients.

TABLE 1

| Category | Examples (Unit: wt. %, ppm) | | | Comparative Examples (Unit: wt. %, ppm) | | | |
| --- | --- | --- | --- | --- | --- | --- | --- |
| | 1 | 2 | 3 | 1 | 2 | 3 | 4 |
| Siloxane resin 1 | 54 | 54 | 54 | 53 | 53 | 54 | 54 |
| Siloxane resin 2 | 22 | 27 | 22 | 22 | 22 | 22 | 22 |

TABLE 1-continued

| Category | Examples (Unit: wt. %, ppm) | | | Comparative Examples (Unit: wt. %, ppm) | | | |
| --- | --- | --- | --- | --- | --- | --- | --- |
| | 1 | 2 | 3 | 1 | 2 | 3 | 4 |
| Siloxane resin 3 | | | 2 | 5 | | 2 | 2 |
| Siloxane resin 4 | | | | | 5 | | |
| Cross-linking resin 1 | 3 | 5 | 8 | | | 8 | 8 |
| Cross-linking resin 2 | 17 | 11 | 9 | | | 9 | 9 |
| Cross-linking resin 3 | | | | 17 | 20 | | |
| M-POSS | 2 | 1 | 2 | | | | |
| C-POSS 1 | | | | | | 2 | |
| C-POSS 2 | | | | | | | 2 |
| Organic polysilazane 1 | | | | 0.7 | 1 | | |
| Organic polysilazane 2 | 1 | 1 | 1.5 | 0.3 | | 1.5 | 1.5 |
| Modified polysilazane | | | 0.5 | | | 0.5 | 0.5 |
| Silane coupling agent | 0.005 | 0.005 | 0.01 | 0.005 | 0.005 | 0.01 | 0.01 |
| Catalyst (ppm) | 3 | 3 | 3 | 3 | 3 | 3 | 3 |
| Reaction retardant 1 (ppm) | 50 | 100 | 150 | | 100 | 150 | 150 |
| Reaction retardant 2 (ppm) | 100 | 50 | | 150 | 50 | | |

Siloxane resin 1: poly(metnylpnenyl)siloxane
Siloxane resin 2: poly(phenylvinyl)-co-(methylvinyl)silsesquioxane
Siloxane resin 3: PDV-1635 (gelest Inc.)
Siloxane resin 4: PW-3522 (gelest Inc.)
Cross-linking resin 1: phenylhydro silsesquioxane
Cross-linking resin 2: dimethylsilylphenylether
Cross-linking resin 3: HPM-502 (gelest Inc.)
M-POSS: polyhedral oligomeric silsesquioxane prepared in above Synthesis Example 1
C-POSS 1: polyhedral oligomeric silsesquioxane prepared in above Comparative Synthesis Example 1
C-POSS 2: polyhedral oligomeric silsesquioxane prepared in above Comparative Synthesis Example 2
Organic polysilazane 1: HTT-1500 (AZ Inc.)
Organic polysilazane 2: HTT-1800 (AZ Inc.) as a resin represented by chemical formula 2
Modified polysilazane: Modified polysilazane prepared in above Synthesis Example 2
Silane coupling agent: methacrylate cyclosiloxane
Catalyst: SIP6830.3 (gelest Inc.)
Reaction retardant 1: ethynyltriethylsilane (gelest Inc.)
Reaction retardant 2: ethynyltrimethylsilane (gelest Inc.)

Test Examples

The physical properties and performance evaluation of the resin compositions for encapsulating optical devices according to the above Examples 1 to 3 and Comparative Examples 1 to 4 were carried out as described below, and the results are shown in the following Table 2.

1) Light transmittance: The compositions were applied into the size of 50 mm×50 mm×1 mm to the top and bottom glass and the surface of Teflon frame and then, they were cured at 150° C. for one hour and at 170° C. for one hour to prepare specimens. The transmittances of the above prepared specimens were measured at 5 points in the wavelengths of 400 to 780 nm using ultraviolet-visible light spectrophotometer (Mecasys Inc.), and light transmittances were evaluated from the obtained average values within the wavelength ranges.

2) Hardness: The compositions were applied onto molds of 20 mm×20 mm×15 mm and then cured at 150° C. for one hour and at 170° C. for one hour to prepare specimens, which were then measured using a hardness tester.

3) Adhesive strength: The compositions were applied onto base materials of 100 mm×15 mm and then two substrates were overlapped to each other and cured at 150° C. for one hour and at 170° C. for one hour to prepare specimens, which were then measured using a universal testing machine (Instron Inc., Product name: UTM-5566).

4) Refractive index: The compositions were applied to the surface of Teflon frame molds of a rectangle size (35 mm×10 mm×1 mm) and cured at 150° C. for one hour and at 170° C. for one hour to prepare specimens. The produced cured films were measured using an Abbe refractometer (589 nm).

5) Water vapor permeability: The compositions were applied to the surface of Teflon molds to become a size of 50 mm×50 mm×1 mm and cured at 150° C. for one hour and at 170° C. for one hour to prepare specimens. The water vapor permeability of the specimens was measured using a moisture permeability tester (PERMATRAN-W, MOCON Inc.) at 37.8° C., 100% RH atmosphere for about 24 hours, and the average values are shown in Table 2 below.

TABLE 2

| | EX. 1 | EX. 2 | EX. 3 | COMP. EX. 1 | COMP. EX. 2 | COMP. EX. 3 | COMP. EX. 4 |
|---|---|---|---|---|---|---|---|
| Light transmittance (%) | 98.1 | 97.5 | 97 | 98.3 | 97 | 93 | 92 |
| Hardness (Shore A) | 70 | 72 | 75 | 35 | 50 | 74 | 74 |
| Adhesive strength (Kgf/cm$^2$) | 20 | 25 | 30 | 15 | 5 | 29 | 30 |
| Refractive Index | 1.53 | 1.53 | 1.54 | 1.53 | 1.52 | 1.54 | 1.54 |
| Water vapor permeability (g/m$^2$)cured | 14 | 15 | 17 | 30 | 40 | 20 | 20 |

As shown in the above Table 2, Examples 1 to 3 according to the present invention showed not only excellent light transmittance and refractive index but also remarkably improved hardness, adhesive strength, and water vapor permeability. In particular, Examples 1 to 3 of the present invention exhibited excellent light transmittance and high reliability compared to Comparative Examples 3 and 4.

Furthermore, since C-POSS of Comparative Examples 1 and 2 is a cage type (a full cage type) and its products show light brown or yellow, it showed a low light transmittance even when prepared into a final product and then cured, in comparison with M-POSS of Synthesis Example 1. Thus, it is not suitable for encapsulating material of the invention for which optical properties are fundamental, and as the platinum catalyst used for synthesis is added to the entire catalyst amount of the composition, it may ultimately have an adverse effect on reliability.

What is claimed is:

1. A resin composition for encapsulating an optical device, comprising
   1) a polyhedral oligomeric silsesquioxane (POSS) of the following chemical formula 1-1; and
   2) an organic polysilazane comprising repeating units as represented in the following chemical formula 2:

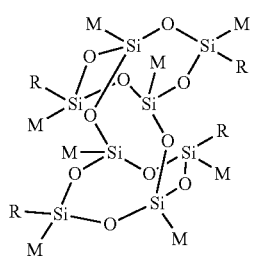

[Chemical formula 1-1]

wherin,
each R is independently a substituent of the following chemical formula 3-1;

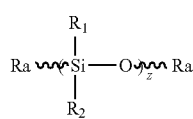

[Chemical formula 3-1]

wherein,
R$_1$ and R$_2$ are each independently a hydrogen, an alkyl or alkenyl having 1 to 20 carbon atoms, or an aryl having 6 to 50 carbon atoms;
one Ra is a hydrogen atom or a chlorine atom and the other is a single bond which links to Si of chemical formula 1-1;

z is an integer of 3 to 20;
each M is independently a methyl or a phenyl;
Rx and Ry are each independently an alkyl or alkenyl having 1 to 20 carbon atoms, or an aryl having 6 to 50 carbon atoms; and
m and n are each independently an integer of 1 to 20, with the proviso that m+n is 2 to 21.

2. The resin composition for encapsulating optical device as claimed in claim 1, wherein the polyhedral oligomeric silsesquioxane of chemical formula 1-1 or 1-2 is used in an amount of 1 to 20 wt. % of the total composition.

3. The resin composition for encapsulating optical device as claimed in claim 1, further comprising a compound comprising repeating units as represented by the following chemical formula 4:

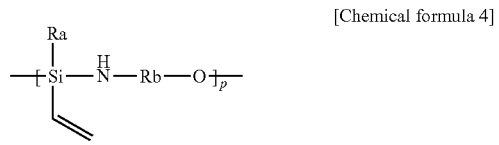

[Chemical formula 4]

wherein,
Ra is an alkyl having 1 to 20 carbon atoms, or an aryl having 6 to 50 carbon atoms;
Rb is a hydrocarbon having 1 to 20 carbon atoms; and
p is an integer of 1 to 15.

4. The resin composition for encapsulating optical device as claimed in claim 3, wherein the compound of chemical formula 4 is used in an amount of 0.1 to 15 wt. % of the total composition.

5. The resin composition for encapsulating optical device as claimed in claim 1, comprising
   1 to 20 wt. % of the polyhedral oligomeric silsesquioxane represented by chemical formula 1-1 or 1-2,
   0.1 to 10 wt. % of the organic polysilazane represented by chemical formula 2,
   30 to 85 wt. % of a siloxane resin, and
   5 to 40 wt. % of a cross-linking resin.

6. The resin composition for encapsulating optical device as claimed in claim 5, further comprising 0.1 to 15 wt. % of the chemical represented by chemical formula 4.

7. The resin composition for encapsulating optical device as claimed in claim 5 or 6, further comprising 1 to 3000 ppm of a catalyst or 1 to 1000 ppm of a reaction retardant.

8. An encapsulation method of an optical device, characterized by using the resin composition for encapsulating optical device of claim 1.

9. The encapsulation method of optical device as claimed in claim 8, wherein the optical device is LED.

10. An encapsulating film for an optical device prepared by using the resin composition for encapsulating optical device of claim 1.

11. A resin composition for an encapsulating optical device, comprising
1) a polyhedral oligomeric silsesquioxane (POSS) of the following chemical formula 1-1:

wherein,
each R is independently a substituent of the following chemical formula 3-1;

[Chemical formula 3-1]

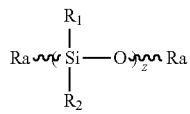

wherein,
$R_1$ and $R_2$ are each independently a hydrogen, an alkyl or alkenyl having 1 to 20 carbon atoms, or an aryl having 6 to 50 carbon atoms;
one Ra is a hydrogen atom or a chlorine atom and the other is a single bond which links to Si of chemical formula 1-1;
z is an integer of 3 to 20; and
each M is independently a methyl or a phenyl.

* * * * *